United States Patent Office 2,835,640

Patented May 20, 1958

2,835,640

RESINOUS COMPOUND FOR POTTING ELECTRONIC COMPONENTS, ETC.

Edward Rolle, San Diego, Calif.

No Drawing. Application June 5, 1952
Serial No. 292,015

8 Claims. (Cl. 260—22)

(Granted under Title 35, U. S. Code (1952), sec. 266)

The invention described herein may be manufactured and used by or for the Government of the United States of America for governmental purposes without the payment of any royalties thereon or therefor.

This invention relates to plastics and more particularly to a thermosetting resinous composition and a novel process of polymerization which is particularly adapted for encapsulating electronic circuits or components and other fragile objects.

Numerous thermosetting resinous mixtures of various compositions have been utilized for casting and embedding a large variety of articles, but none of these were completely satisfactory for encapsulating electronic circuits or various types of electronic components, primarily because the previously known thermosetting plastics did not successfully resist the heat generated within the electronic circuits, particularly from the hot power tubes, or the dielectric constants and power factors were not suitable for encapsulation of certain types of electronic components and circuits. Many of these resinous mixtures contained metal salts which vitiated the electronic characteristics or they reacted to certain materials used in the electronic circuits in such a manner as to cause flaws in the casting. In most prior methods of molding, the heat generated or applied during polymerization melted certain materials such as wax, lacquer, varnish, etc., or some of the ingredients in the resinous compound caused chemical reactions with the materials used in encapsulated components to form cracks and fissures in the resulting plastic.

One object of the present invention is to provide a novel thermosetting resinous compound into which electronic circuits or components and other objects may be successfully cast with substantially no effect on the materials, characteristics or operation thereof.

Another object of the present invention is the provision of a novel process of polymerization wherein the thermosetting resinous composition is polymerized under carefully controlled conditions of temperature, both internal and external, so that fragile and meltable elements or materials are not decomposed or in any way affected.

A still further object of the present invention is to provide a unique method of polymerization wherein no heat is supplied at any time, but refrigeration is utilized to control the exothermic heat of the chemical reactions during polymerization so that the internal temperatures remain nearly constant or do not rise above a certain optimum.

Still another object of the present invention is to provide a thermosetting resinous composition and method of polymerization which will not adversely affect the materials normally utilized for the components of an electronic circuit such as wax, lacquer, varnish, paint, etc.

Still another object of the present invention is the provision of a novel thermosetting resinous composition for encapsulating electronic circuits and components which are polymerized without the presence of any metal or metal salts which tend to vitiate the electronic characteristics.

Another object of the present invention is to provide a novel resinous composition and a method of polymerizing same wherein the molecules in the resulting plastic are substantially nonpolar so that the dielectric constant is substantially equivalent to that of air and will have no appreciable effect on the operation of an electronic circuit and/or components encapsulated therein.

A still further object of the present invention is the provision of a novel resinous composition and method of polymerization wherein the various ingredients are balanced to provide a complete chemical reaction which can be controlled by the selection and proportioning of the ingredients and is not a natural polymerization facilitated by external heat, light or a catalyst.

Other objects and many of the attendant advantages of this invention will be readily appreciated as the same becomes better understood by reference to the following detailed description of the basic process and a number of specific examples of various different compositions successfully utilizing the principles of the present invention.

The invention basically comprises a mixture of a thermosetting unsaturated organic polyester resin containing an organic monomer such as styrene together with a number of additive chemicals to be described more particularly hereinafter. The resulting mixture polymerizes within a few hours, preferably under refrigeration into a copolymer having a low dielectric constant, a low power factor, high tensile and compressive strength, high resistance to impact, and is harmless to any materials commonly utilized in electronic circuits and even to plant life and other fragile materials or delicate objects. The resulting plastic is also highly resistant to the heat normally generated in electronic circuits, particularly from hot power tubes.

The basic material used in forming the composition is an unsaturated polyester resin comprising one or more of a group of unsaturated organic resins which are the reaction products of a polybasic acid and/or anhydride such as phthalic, succinic, adipic, sebacic, maleic, etc. reacted with one or more of various polyhydric alcohols such as ethylene glycol, diethylene glycol, other higher glycols, glycerol, sorbitol, etc. mixed with one or more of a group of nonomers such as nonomeric styrene. The kind and proportion of the monomer may be varied in a number of ways to produce plastics particularly adapted for a specific purpose and may depend on factors such as the size of the casting, the time allowed for polymerization, and the ultimate characteristics desired in the finished casting. The proportion of monomer in the polyester may be varied to produce a polymer of soft flexible character or a relatively hard rigid material.

The basic principles of the present invention are applicable to any thermosetting resin of the general type as indicated by the following representative formula:

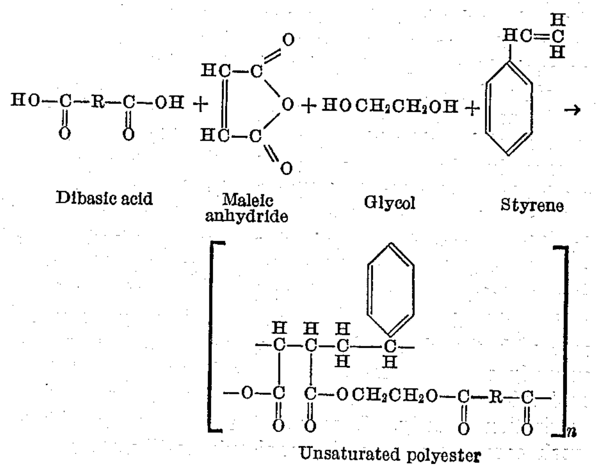

Unsaturated polyester

Unsaturated polyesters of the above type are marketed under various trade names such as "Kriston," "Laminac," "Marco," "Paraplex," "Plaskon," "Selectron," and "Vibrin." However, some of the above trade name compositions also include certain additives which serve as inhibitors or catalysts and it is desirable in following the principles of the present invention to obtain unsaturated polyesters which are free of any additive agents which may affect the processing and require some adjustment of the formulae to compensate for the chemicals added by the manufacturer for certain other particular purposes, but these are difficult to obtain and the examples disclosed herein have been so adjusted.

Following is a detailed disclosure of the fundamental compounding with reference to the general class of chemicals and setting forth the theory of the chemical reactions involved, as now understood. The base stock is one of the unsaturated polyesters of the class set forth above, none of which have been found completely satisfactory as sold for the practical encapsulation of electronic circuits or components.

The first chemical added is a phenyl such as hydrogenated terphenyl which possesses a radical which may be readily separated and preferably one which will take active part in the polymerization. With hydrogenated terphenyl the hydrogen is apparently liberated and aids in breaking the double bonds on other polymerizable molecules and thus facilitates the cross tying of loose bonds. Furthermore, with the hydrogen released the three rings of the terphenyl possess a free bond with which to tie across in the process of polymerization. (A partially hydrogenated polyphenyl mixture containing a predominant amount of hydrogenated isomeric terphenyls is commercially available under the trade name HB-40.)

Another chemical added is a primary alcohol such as benzyl alcohol which oxidizes readily yielding benzaldehyde or benzoic acid and is readily esterified with an organic acid and a little heat. Since an excess of organic acid exists in the polyester base stock, usually with a small amount of mineral acid, a benzyl alcohol product apparently picks up the acid aided by the exothermic heat of the addition polymerization and this aids in the further copolymerization in the process.

The next chemical which is added to the base stock is a phenol having one or more benzene rings with the hydroxy group preferably in the beta position such as beta naphthol or any equivalent chemical having similar chemical characteristics in the reaction. Beta naphthol has two benzene rings and a weakly acidic reaction which furnishes an acid assisting esterification particularly in the presence of the exothermic heat of reaction, and after reaction affords two benzene rings with a loose bond for copolymerization. Apparently the beta naphthol actually facilitates the polymerization of the other molecules in the mixture in addition to taking part itself in the polymerization. The rate of polymerization seems to depend directly upon the proportion of beta naphthol or equivalent chemical utilized in the mixture, up to a certain optimum.

The next chemical added is an unsaturated fatty acid such as oleic acid which possesses a double bond which apparently affords an opportunity for further copolymerization and adds flexibility to the final product.

The final chemical added and one of the more critical in this process is an oxidizing agent, preferably an organic peroxide comprising phenyl groups, which will start to release oxygen at normal room temperature and which will release the oxygen at approximately the same rate with the change in temperature. The oxygen apparently serves to combine with a loose bond on two molecules and thus causes polymerization or copolymerization directly. It may also serve to react with a weak component on a ring molecule to liberate a ring compound with a loose bond which enters into the polymerization process.

In utilizing various of the trade name unsaturated polyester resins noted supra, it has been necessary to vary considerably the peroxides added to obtain optimum results, particularly for encapsulating electronic circuits and components. In some instances it has been necessary to use a multiplicity of peroxides, since the temperature at which a peroxide starts to release oxygen may vary with each peroxide, and the rate of release with increasing temperature may also vary. Therefore, in order to carry out or implement the basic principle of the present invention, it is necessary to select a peroxide or a mixture of peroxides such that the release of oxygen will begin at the desired temperature and the production of oxygen in the resinous compound during polymerization will be at a uniform rate in order to produce a perfect plastic.

The typical preparation of a mixture, which should be done just prior to molding, will be described in conjunction with one specific example illustrating one preferred embodiment of the present invention which is particularly useful for encapsulating electronic circuits and components, as well as embedding many other objects, and for various other uses.

*Example I*

| | Percent by weight |
|---|---|
| *a.* Unsaturated polyester | 92 |
| *b.* A partially hydrogenated polyphenyl mixture such as HB40 supplied by Monsanto Chemical Co. | 2 |
| *c.* Benzyl alcohol | 2 |
| *d.* Beta naphthol | 1 |
| *e.* Oleic acid | 2 |
| *f.* Peroxides—mixture derived from petroleum such as Uniperox Sixty supplied by R. T. Carter | 1 |

All of the above chemicals should be as pure as possible and *c, d,* and *e* should be of U. S. P. quality. Chemical *d* should be powdered and thoroughly ground with mortar and pestle immediately before mixing the composition. All of the added ingredients, i. e., all except the unsaturated polyester, are preferably mixed together, then added to the unsaturated polyester, and finally thoroughly mixed, preferably by a mechanical mixer, until all of the solid ingredient is completely dissolved and without stirring air into the viscous liquid composition.

The resulting composition can be immediately poured into the mold surrounding any object which it is desired to encapsulate or embed and the mold is immediately subjected to refrigeration preferably at from 15° to −10° centigrade, depending on the size and shape of the casting. Polymerization will be substantially complete within 4 or 5 hours, but it is usually desirable to permit the casting to remain under refrigeration for a period up to 8 or 9 hours. The mold is then set out at ambient temperatures for 4 or 5 hours and then, if desired, at elevated temperatures up to 46° centigrade, not to exceed 4 hours to complete polymerization which may be retarded, particularly in the later stages, by low temperatures, and the casting will come slowly to ambient temperature aided by the small amount of exothermic heat generated during final stages of polymerization.

Other specific examples of plastics formed in accordance with the basic concepts of the present invention have been developed for particular purposes and are listed below. However, these examples are not to be considered as exhaustive, since there are many variations in the nature and proportions of the polyesters used as the base stock and many variations in the specific additives which may be combined therewith in accordance with the teachings of the present invention to meet the particular needs or specifications as to electrical, physical and chemical properties in the final plastic.

The following compositions are merely given for the purpose of illustrating some of the multitudinous variations coming within the scope of the present invention.

*Example II*

| | Percent by weight |
|---|---|
| a. Unsaturated polyester | 91 |
| b. A partially hydrogenated polyphenyl mixture such as HB40 supplied by Monsanto Chemical Co | 2 |
| c. Benzyl alcohol | 2 |
| d. Beta naphthol | 1 |
| e. Oleic acid | 2 |
| f. Benzoyl peroxide (pure) | 2 |

This plastic was developed primarily for encapsulation of subminiature electronic circuits and is extremely tough in resisting shock, has a high compressive strength, a dielectric constant of 3.00 and a power factor from 0.020 to 0.025. This plastic is processed in a manner indicated above and is cured by refrigeration only with no heat required for final polymerization.

*Example III*

| | |
|---|---|
| a. Unsaturated polyester | 88% by weight. |
| b. A partially hydrogenated polyphenyl mixture such as HB40 supplied by Monsanto Chemical Co | 2% by weight. |
| c. Benzyl alcohol | 2% by weight. |
| d. Beta naphthol | 1% by weight. |
| e. Oleic acid | 2% by weight. |
| f. Acetyl peroxide | 3% by weight. |
| g. Cobalt naphthenate | 4 drops per 100 grams of resin. |
| h. Diethylphthalate | 2% by weight. |

This process is also carried out by refrigeration only, but polymerization is somewhat slower than in Example I. It requires less refrigeration (0 to −5° C.) and no heat, but takes a longer period at ambient temperature for completion of polymerization after removing it from refrigeration. In this composition chemical *g* also acts as an oxidizer and provides benzene rings which copolymerize with the other constituents, and chemical *h* furnishes resilient benzene rings which copolymerize in a manner to toughen the plastic.

*Example IV*

| | Percent by weight |
|---|---|
| a. Unsaturated polyester | 91½ |
| b. A partially hydrogenated polyphenyl mixture | 2 |
| c. Benzyl alcohol | 2 |
| Benzyl acetate | 2 |
| d. Beta naphthol | 1 |
| e. Oleic acid | 1 |
| f. Benzoyl peroxide (pure) | 0.5 |

This plastic polymerizes at a relatively slow rate and requires considerable refrigeration to control the exothermic heat. It was developed for encapsulation of an antenna mast and possesses unusual impact strength, high compression strength, machines and drills very well and has a dielectric constant of 2.8 and power factor 0.017. The benzyl acetate tends to slow down the effect of the benzyl alcohol.

*Example V*

| | |
|---|---|
| a. Unsaturated polyester | 92% by weight. |
| b. A partially hydrogenated polyphenyl mixture | 2% by weight. |
| c. Benzyl alcohol | 2% by weight. |
| Benzyl acetate | 2% by weight. |
| d. Beta naphthol | 1% by weight. |
| e. Dodecanoic acid (lauric acid) | 1% by weight. |
| f. Ditertiary butyl peroxide | 2 drops per 100 grams of resin. |
| Methyl ethyl ketone peroxide | 2 drops per 100 grams of resin. |

This plastic polymerizes with extreme rapidity so that it is necessary to avoid any bubbles forming during the pouring of the resin since they will be entrapped by the rapid polymerization. The processing requires considerable refrigeration, but no heating. The benzyl acetate tends to slow down the effect of the benzyl alcohol.

While the exact molecular structure in any particular plastic or casting formed from long chain polymers and copolymers cannot be exactly known because of the fact that a double bond may break in different manners and a loose bond resulting may join across to another molecule in varying ways, the theory indicated above appears to conform to generally accepted concepts of the reactions of these chemicals and is substantiated by the results obtained. The unsaturated polyesters indicated in the formula above usually polymerize in long straight chains in a single plane and hence are easily separated, tending to make the plastic brittle and offer little resistance to heat. The thermosetting plastic of the present invention utilizes a variety of molecules including benzene rings such as naphthol, benzyl, phthalate, naphthenate, phenyl, diphenyl, tri-phenyl, or terphenyl compounds which join with other molecules having loose bonds in the process of polymerization or copolymerization with a resulting heterogeneous molecular structure which is bonded in three dimensions by many resilient rings, so as to increase the strength, flexibility and resistance to heat.

The only product given off by the reactions involved in the present invention, when the ingredients are correctly proportioned, is an exothermic heat of reaction which helps to form additional polymerizable products as well as facilitates the normal polymerization and the other chemical reactions involved.

The present method of compounding and processing permits control of the exothermic heat generated both by the compounding, particularly the amount of beta naphthol and the amount and type of peroxide utilized, and also by the use of refrigeration which controls the temperature as well as the period of time during which exothermic heat is generated, and thus the time required for complete polymerization.

This control of the heat generated and the maximum temperature attained must necessarily be varied in accordance with the dimensions of the casting and the particular components or articles embedded therein, so as to avoid damage to any materials, particularly those having a low melting point and still obtain complete polymerization in a minimum length of time.

It will be obvious that the plastics of the present invention will have many uses for encapsulating or embedding various types of articles or may be used by itself to form various articles with suitable dyes, pigments, etc., if desired, for various utilitarian or decorative purposes. In one instance, very fine iron powder has been incorporated in the plastic to form a high permeable material which has obvious uses in many magnetic circuits.

Obviously many modifications and variations of the present invention are possible in the light of the above teachings. It is therefore to be understood that within the scope of the appended claims the invention may be practiced otherwise than as specifically described.

What is claimed is:

1. A composition as set forth in claim 5 comprising the following ingredients in the proportions by weight specified:

| | Percent |
|---|---|
| Unsaturated polyester | 92 |
| A partially hydrogenated mixture of polyphenyls | 2 |
| Benzyl alcohol | 2 |
| Beta naphthol | 1 |
| Oleic acid | 2 |
| Organic peroxide mixture | 1 |

2. A composition as set forth in claim 5 comprising the following ingredients in the proportions by weight specified:

| | Percent |
|---|---|
| Unsaturated polyester | 91 |
| A partially hydrogenated mixture of polyphenyls | 2 |
| Benzyl alcohol | 2 |
| Beta naphthol | 1 |
| Oleic acid | 2 |
| Benzoyl peroxide | 2 |

3. A composition as set forth in claim 5 comprising the following ingredients in the proportions by weight specified:

| | Percent |
|---|---|
| Unsaturated polyester mixture | 91.5 |
| A partially hydrogenated mixture of polyphenyls | 2 |
| Benzyl alcohol | 2 |
| Benzyl acetate | 2 |
| Beta naphthol | 1 |
| Oleic acid | 1 |
| Benzoyl peroxide | 0.5 |

4. A composition as set forth in claim 5 comprising the following ingredients in the proportions by weight specified:

| | |
|---|---|
| Unsaturated polyester mixture | 92%. |
| A partially hydrogenated mixture of polyphenyls | 2%. |
| Benzyl alcohol | 2%. |
| Benzyl acetate | 2%. |
| Beta naphthol | 1%. |
| Dodecanoic acid (lauric acid) | 1%. |
| Ditertiary butyl peroxide | 2 drops/100 grams. |
| Methyl ethyl ketone peroxide | 2 drops/100 grams. |

5. A plastic composition of matter comprising a polymerized mixture of a predominant proportion of from about 85 to 95 percent by weight of an unsaturated polyester formed by reacting polybasic acids and anhydrides thereof selected from the group consisting of succinic, phthalic, adipic, sebacic and maleic acids and anhydrides thereof with at least one polyhydric alcohol from the group consisting of ethylene glycol, diethylene glycol, triethylene glycol, glycerol, sorbitol and other higher glycols, and monomeric styrene; and minor proportions of less than about 3 percent by weight of benzyl alcohol, less than about 2 percent by weight of beta naphthol, less than about 3 percent by weight of a partially hydrogenated mixture of polyphenyls containing a predominant amount of hydrogenated isomeric terphenyls, less than about 3 percent by weight of a monobasic acid selected from the group consisting of oleic acid and dodecanoic acid, and less than about 4 percent by weight of at least one organic peroxide selected from the group consisting of benzoyl peroxide, acetyl peroxide, ditertiary butyl peroxide and methyl ethyl ketone peroxide.

6. A process which comprises polymerizing a mixture of a predominant proportion of an unsaturated polyester formed by reacting polybasic acids and anhydrides thereof selected from the group consisting of succinic, phthalic, adipic, sebacic and maleic acids and anhydrides thereof with at least one polyhydric alcohol and a monomeric styrene; and minor proportions of about less than 2 percent by weight of beta naphthol, less than about 3 percent by weight of a partially hydrogenated mixture of polyphenyls containing a predominant amount of hydrogenated isomeric terphenyls, less than about 3 percent by weight of benzyl alcohol, less than about 3 percent by weight of oleic acid, and less than about 4 percent by weight of at least one organic peroxide; the initial polymerization being under refrigeration at temperatures from 15 degrees to −10 degrees centigrade for at least four hours; and completing polymerization by exothermic heat of the reaction under conditions of ambient room temperature.

7. A process which comprises polymerizing a mixture of a predominant proportion of an unsaturated polyester formed by reacting a polybasic organic acid having at least two carboxyl groups and maleic anhydride with at least one polyhydric alcohol, and monomeric styrene; and minor proportions of about less than 2 percent by weight of beta naphthol, less than about 3 percent by weight of a partially hydrogenated mixture of polyphenyls containing a predominant amount of hydrogenated isomeric terphenyls, less than about 3 percent by weight of benzyl alcohol, less than about 3 percent by weight of oleic acid, and less than about 4 percent by weight of at least one organic peroxide; the initial polymerization being under refrigeration at temperatures from 15 degrees to −10 degrees centigrade for at least four hours; and completing polymerization by exothermic heat of the reaction under conditions of ambient room temperatures.

8. A plastic composition of matter comprising a mixture consisting essentially of from about 85 to 95 percent by weight of an unsaturated polyester formed by reacting at least one polybasic organic acid having at least two carboxyl groups with at least one polyhydric alcohol and styrene, and measured proportions of less than about 2 percent by weight of beta naphthol, less than about 3 percent by weight of benzyl alcohol, less than about 3 percent by weight of a partially hydrogenated mixture of polyphenyls containing a predominant amount of hydrogenated isomeric terphenyls, less than about 3 percent by weight of oleic acid, and less than about 4 percent by weight of at least one organic peroxide.

References Cited in the file of this patent

UNITED STATES PATENTS

| | | |
|---|---|---|
| 2,577,005 | Giacomo | Dec. 4, 1951 |
| 2,579,596 | Minter et al. | Dec. 25, 1951 |
| 2,583,150 | Minter et al. | Jan. 22, 1952 |
| 2,705,836 | Watson | Apr. 12, 1955 |

OTHER REFERENCES

Paraplex P-10, Rohm & Haas publication, 1945, page 3.

Paraplex for Laminating and Casting Applications, Rohm & Haas Co. publication, August 1947, pp. 6, 15 and 16.

Paraplex in Cements and in Filling and Caulking Compounds, Rohm & Haas publication, August 1949, page 5.

The Paraplex "P" Series Resins, Rohm & Haas Co., publication, May 1950, pp. 1 and 13.